United States Patent
Hwee et al.

(10) Patent No.: US 6,734,039 B2
(45) Date of Patent: May 11, 2004

(54) SEMICONDUCTOR CHIP GRID ARRAY PACKAGE DESIGN AND METHOD OF MANUFACTURE

(75) Inventors: Tan Kim Hwee, Singapore (SG); Roman Perez, Singapore (SG); Kee Kwang Lau, Singapore (SG); Alex Chew, Singapore (SG); Antonio Dimaano, Singapore (SG)

(73) Assignee: Advanpack Solutions Pte Ltd., Singapore (SG)

( * ) Notice: Subject to any disclaimer, the term of this patent is extended or adjusted under 35 U.S.C. 154(b) by 0 days.

(21) Appl. No.: 10/236,385

(22) Filed: Sep. 6, 2002

(65) Prior Publication Data

US 2004/0046238 A1 Mar. 11, 2004

(51) Int. Cl.[7] .................. H01L 21/44; H01L 21/48; H01L 21/50; H01L 23/28
(52) U.S. Cl. ......................... 438/106; 257/787
(58) Field of Search ................. 438/106, 111, 438/112, 123, 124; 257/701, 702, 787, 788

(56) References Cited

U.S. PATENT DOCUMENTS

| | | | |
|---|---|---|---|
| 5,596,227 A | 1/1997 | Saito | 257/701 |
| 5,969,426 A | 10/1999 | Baba et al. | 257/778 |
| 6,166,433 A | 12/2000 | Takashima et al. | 257/702 |
| 6,331,939 B1 * | 12/2001 | Corisis et al. | 361/784 |

OTHER PUBLICATIONS

U.S. patent application Publication US 2002/0033412 A1 to Tung, Pub. Date Mar. 21, 2002, "Pillar Connections for Semiconductor Chips and Method of Manufacture".

* cited by examiner

Primary Examiner—Craig A. Thompson
(74) Attorney, Agent, or Firm—George O. Saile; Stephen B. Ackerman; Stephen G. Stanton

(57) ABSTRACT

A chip level package utilizing a CGA is described. A semiconductor chip with pillars is molded in an encapsulant. Solder balls are added and connected to the chip pillars. The final package does not require a first level substrate or interposer and is able to be assembled to the next level as is.

19 Claims, 6 Drawing Sheets

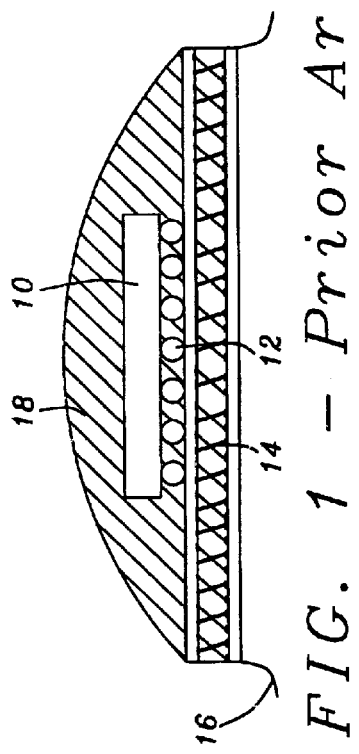
FIG. 1 – Prior Art
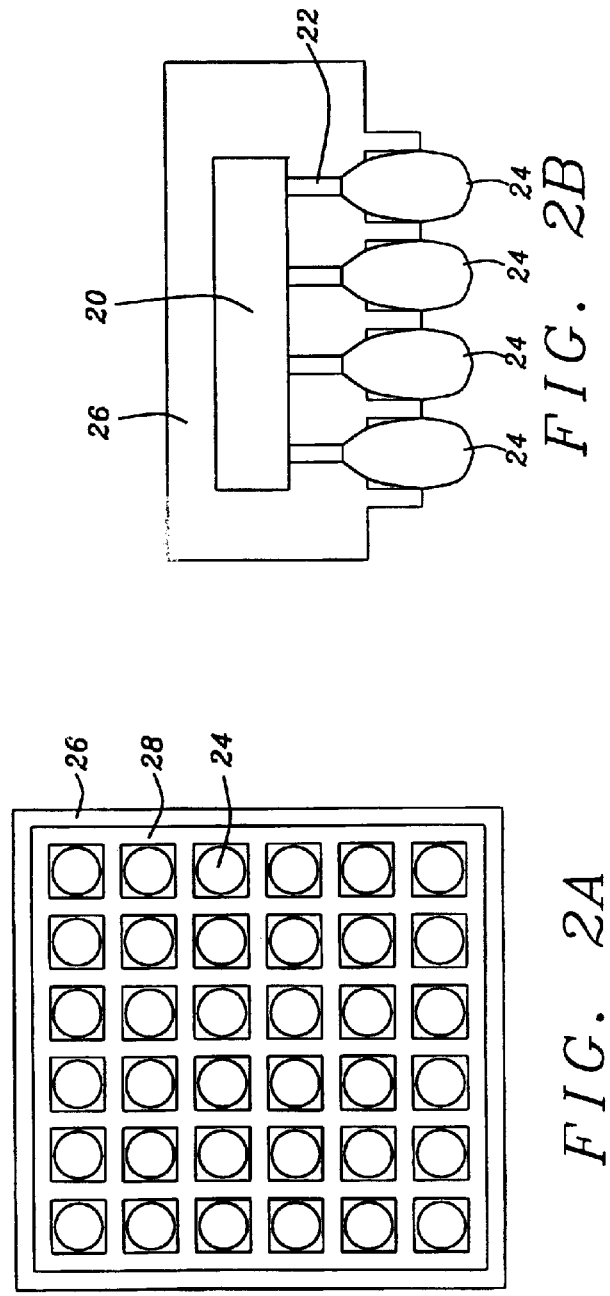
FIG. 2A
FIG. 2B

US 6,734,039 B2

SEMICONDUCTOR CHIP GRID ARRAY PACKAGE DESIGN AND METHOD OF MANUFACTURE

RELATED PATENT APPLICATION

This application is related to Ser. No. 10/236,337, filing date Sep. 6, 2002, assigned to a common assignee.

BACKGROUND OF THE INVENTION

1. Field of the Invention

This invention relates in general to the design and method of manufacture of packages for semiconductor chips, and the input, output (I/O), interconnections to the chips, and more specifically to a semiconductor package that incorporates a molding compound to encapsulate the semiconductor chip and allows the semiconductor chip to be interconnected to other devices without the use of a first level package or interposer.

2. Description of the Related Art

The following three U.S. patents and one U.S. patent application relate to semiconductor chip packaging designs.

U.S. Pat No. 5,596,227 issued Jan. 21, 1997, to H. Saito discloses a semiconductor chip wire bonded and molded to a printed circuit interposer containing BGA interconnects.

U.S. Pat. No. 5,969,426 issued Oct. 19, 1997, to S. Baba et. al. describes a semiconductor chip flip-chip bonded and molded on a printed circuit substrate containing BGA interconnects.

U.S. Pat. No. 6,166,433 issued Dec. 26, 2000, to A. Takashirna et. al. shows a semiconductor chip bonded on a FPC tape that contains a BGA.

U.S. Pat. Application Publication, U.S. 2002/0033412A1, published Mar. 21, 2002, by F. Tung describes the use of Cu copper pillars on semiconductor chips, and is assigned to the same assignee as the instant invention.

The advent of VLSI technology in the semiconductor field has resulted in the demand for high-density packaging. Semiconductor packaging traditionally has three levels of package. The first level, a single chip module (SCM) is made up of a semiconductor chip attached to a substrate. A substrate and chip assembly is usually molded in an encapsulant for environmental protection. The second level of package, usually a printed circuit card, mounts and interconnects the single chip modules and has a connector system to the third level package, usually a planar printed circuit board.

Elimination of a level of package has been a driving force in electronic system design in the recent past. This reduction in packaging levels would allow for closer spacing of semiconductor chips thereby reducing signal delay times. One design currently in use is direct chip attach (DCA). In this design chips are flip-chip mounted onto a substrate, usually ceramic, and the assembly sealed in an enclosure for environmental protection. The environmental protection is required to protect the semiconductor and interconnections against corrosive elements and mechanical disturbances. The inclusion of enclosures for environmental protection results in larger packages with larger distances between semiconductor chips and thereby longer signal delays.

Several interconnection technologies have been developed for use in DCA designs. TAB tape utilizes the periphery of the semiconductor chip as does fine pitch surface mount (FPT). Inherent in these designs is that the peripheral leads increase the space required by each semiconductor chip. Again this increase in chip spacing results in longer signal delays.

The ball grid array (BGA) technology is an area array interconnect design, wherein the front surface of the semiconductor chip is utilized for an array of solder spheres used to interconnect to the next level of package. This arrangement allows for the interconnects to remain within the area of the semiconductor chip.

As dimensions of semiconductor devices became smaller an additional demand on semiconductor chip interconnects has emerged. Alpha particles emitted from solder alloys have been shown to cause semiconductor devices to malfunction. Interconnections that contain solder alloys need to be physically spaced away from the semiconductor devices. One design approach is to include copper pillars on the surface of the semiconductor chips. This approach is disclosed in U.S. Patent Application Publication U.S. 2002/0033412A1 dated Mar. 21, 2002. The copper pillars are incorporated between the solder of the BGA and the surface of the semiconductor chip so as to reduce the effect of the alpha particles on the devices.

First level package designs need to address the following:

Allow for reliable interconnections to the chip surface and to the next level of package.

Protect the chip and the interconnects from chemical corrosion.

Protect the chip from physical and mechanical disturbances, (shock and vibrations.)

A present design that has been shown to be capable of addressing the above demands is shown in FIG. 1 (Prior Art). A semiconductor chip 10 that has a BGA 12 on the front surface is bonded onto an interposer 14 that has printed metallurgy to connect the chip I/Os to peripheral TAB connections 16. The assembly is encapsulated in a plastic compound 18 for environmental protection. Although this design satisfies the criteria set above it has the disadvantage of increasing the area required by the semiconductor chip by 4x~9x, due to the use of the interposer.

SUMMARY OF THE INVENTION

The main objective of the invention is to provide a package design for semiconductor chips that eliminates the need for a first level package. The package design should provide reliable interconnections to the chip and to the next level of package. In addition it needs to protect the semiconductor chip and the interconnections from the environment.

Another objective is for the invention to provide a method for manufacturing the semiconductor chip package in a reliable and efficient manner.

An additional objective is for the package to have a minimal impact on increasing the area required by the semiconductor chip.

The above objectives are achieved by the present invention by providing a design and method of manufacture for a semiconductor chip grid array (CGA) package.

An embodiment of the present invention is shown in FIG. 2B. The semiconductor chip 20 with conductive pillars 22 is fully encapsulated in a molding compound 26 that incorporates castellations 28 for better electrical isolation of the interconnects. A bottom view is shown in FIG. 2A. The package has a fully encapsulated or molded semiconductor chip and provides a CGA for interconnect to the next level of package while eliminating the need for a substrate or interposer.

A manufacturing method for the semiconductor CGA package utilizes a copper lead frame tape that carries the semiconductor chips. The semiconductor chips include solderable pillars. The tape with the semiconductor chips mounted progresses through a molding process that forms a molded panel of a quantity of chips. The units are then separated from the tape and solder balls are mounted on the pillars. The units may be tested at this stage. The molded semiconductor CGA assemblies are then separated into single chip modules.

BRIEF DESCRIPTION OF THE DRAWINGS

FIG. 1 is a conventional single chip module of the prior art.

FIG. 2A is a bottom view of a first embodiment of the CGA of the invention.

FIG. 2B is a cross-sectional view of a first embodiment of the CGA of the invention.

DETAILED DESCRIPTION OF THE PREFERRED EMBODIMENT

Figure 3B:
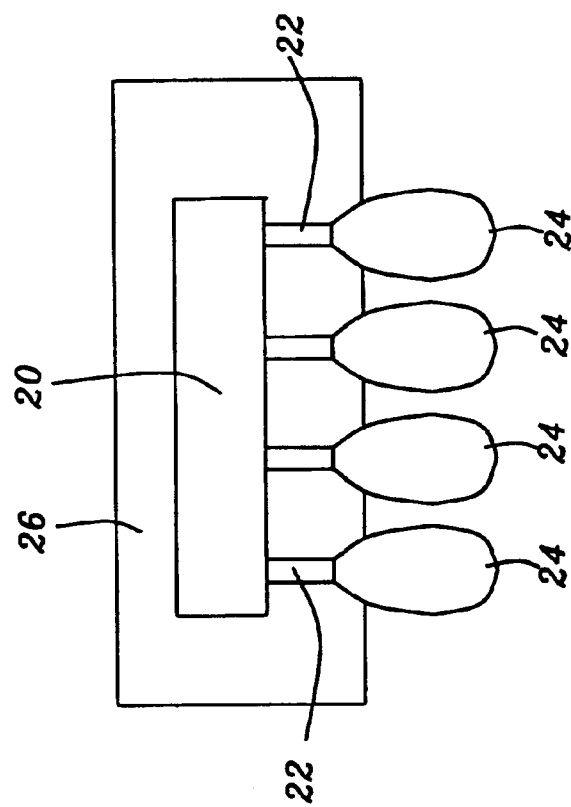
FIG. 3B is a cross-sectional view of a second embodiment of the CGA of the invention.

The decrease in semiconductor device sizes has resulted in VLSI integrated circuit chips with a large number of circuits per chip. The increase in circuits per chip has resulted in increased demand for interconnections to the chip. In order to meet the demand for the higher number of interconnections the use of BGA interconnection technology is being used extensively. BGA or solder ball technology has shown it can provide the high interconnection density required by allowing for close spacing of the interconnects as well as utilizing the total area of the semiconductor chip.

The new micron sized devices have been shown to be susceptible to alpha particle emissions that cause significant errors. Lead and lead alloys emit small amounts of alpha particles. In order to minimize the deleterious effects of the alpha particles copper pillars have been used. See U.S. Patent Application Publication U.S. 2002/0033412A1 herein incorporated by reference. The pillars displace the lead based solder and move it to a distance from the semiconductor devices as to minimize the alpha particle effects.

The present invention discloses a package design and method of manufacture for semiconductor chips that utilize pillar interconnections. The present invention is shown in FIG. 2B. The semiconductor chip 20 that includes solder tipped copper pillars 22 is molded in an opaque encapsulant 26 that surrounds the chip and the pillar. Lead-tin solder balls or solder paste 24 of different compositions are attached to the solder tip pillars and extend beyond the encapsulant for connection to the next level of package. The molded encapsulant 26 is fashioned to have a grid of castellations 28 that isolate each solder ball as shown in FIG. 2A.

Figure 3A:
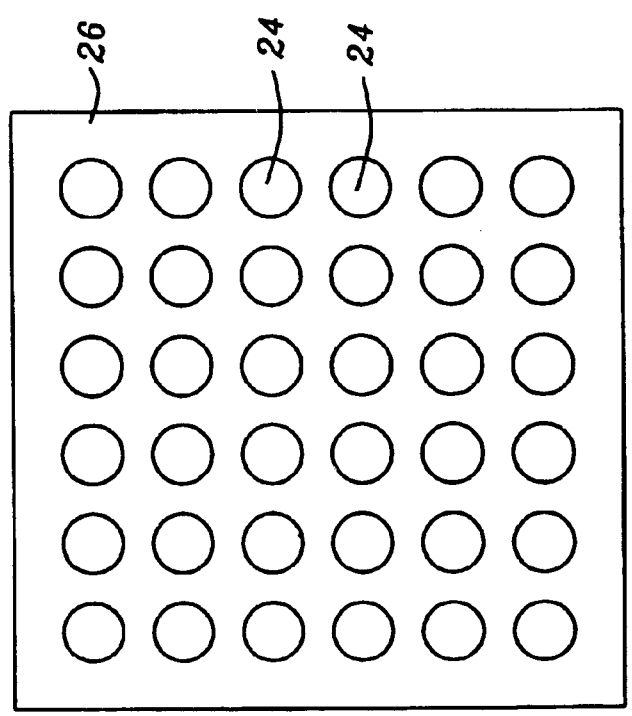
FIG. 3A is a bottom view of a second embodiment of the CGA of the invention.

A second embodiment of the present invention utilizes a lead frame tape without any serrations, which results in a semiconductor chip package as shown in FIGS. 3B and 3A.

Figures 4A, 4B:
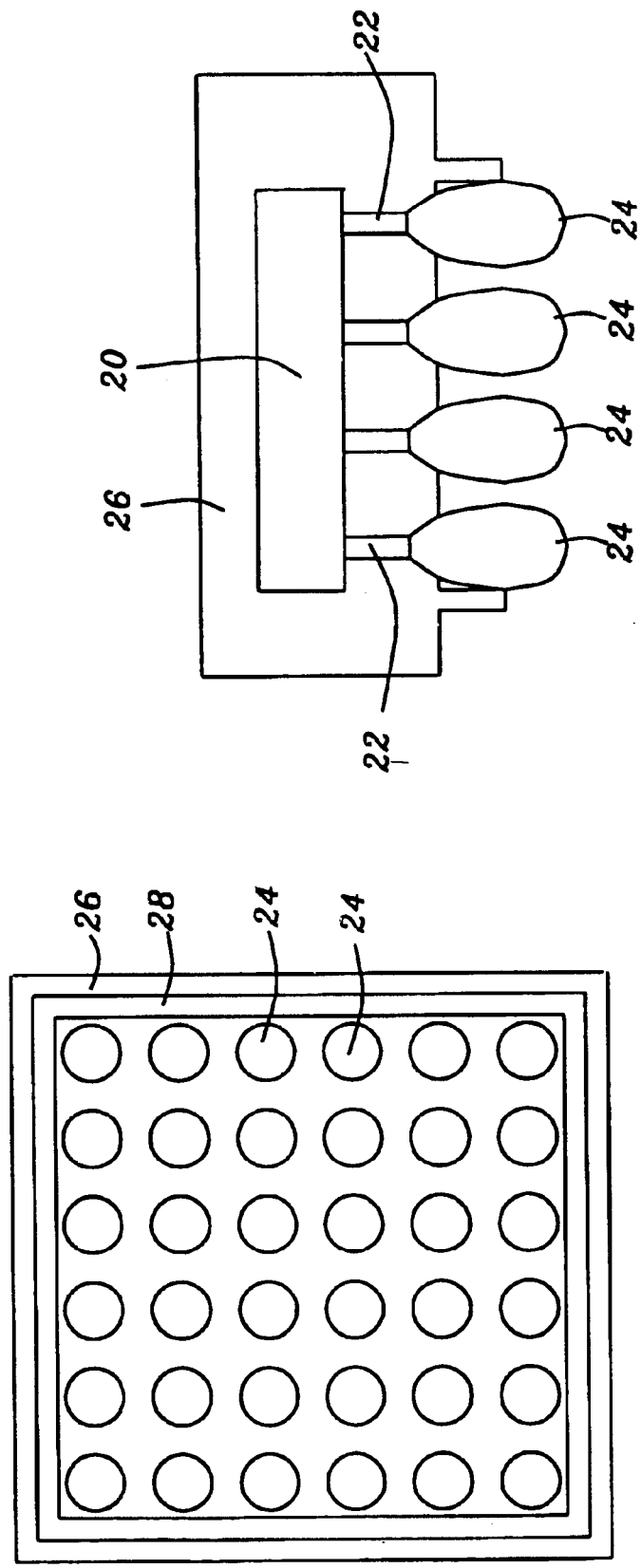
FIG. 4A is a bottom view of a third embodiment of the CGA of the invention.
FIG. 4B is a cross-sectional view of a third embodiment of the CGA of the invention.

In a third embodiment of the present invention the lead frame tape is serrated in a manner, which delineates each individual semiconductor chip package with a castellation 28 as shown in FIGS. 4B and 4A.

The CGA module designs shown in FIGS. 2A–4B satisfy the demands of a first level package. Semiconductor chip 20 is molded in an encapsulant for environmental protection, the solder balls or solder paste of the CGA are properly positioned for the next level of assembly and reliably connected to the semiconductor chip pillars.

Figure 5:
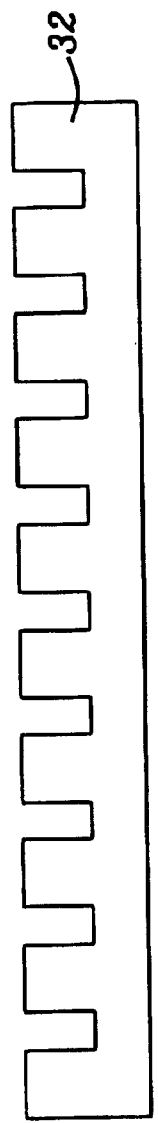
FIG. 5 is a cross-sectional view of the etched lead frame tape of the invention.

The method of manufacture of the CGA semiconductor module of the present invention and disclosed herein consists of the following steps:

In a first embodiment of the invention, a lead frame tape 32 shown in FIG. 5 is etched to provide castellations to be formed during the molding process. The lead frame tape is etched to allow for better mold compound flow.

Figure 6:
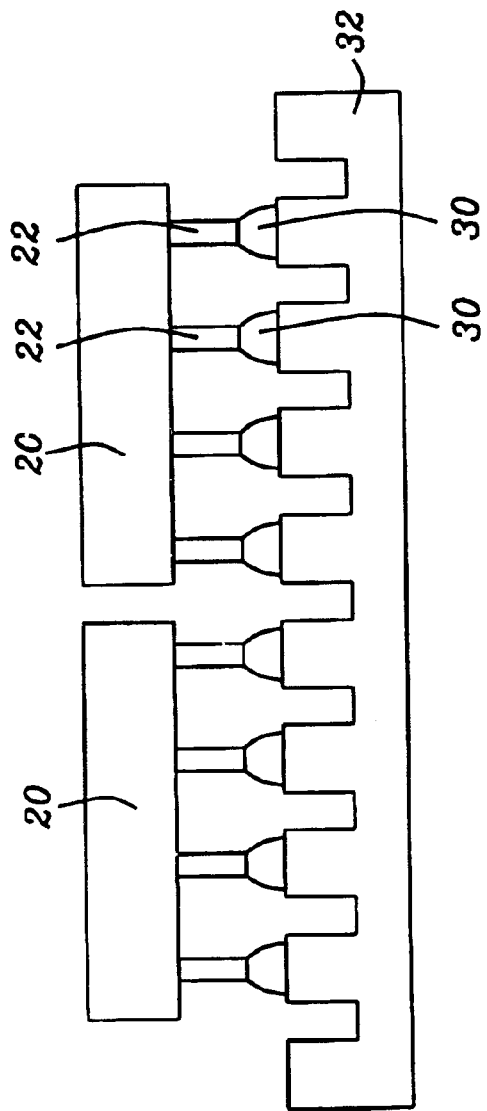
FIG. 6 is a cross-sectional view of chips mounted on the lead frame tape of the invention.

Semiconductor chips 20 are attached to the lead frame tape 32 by soldering, as shown in FIG. 6. As shown in FIG. 6, the lead frame tape openings 29 are offset from the chip pillars 22.

Figure 7:
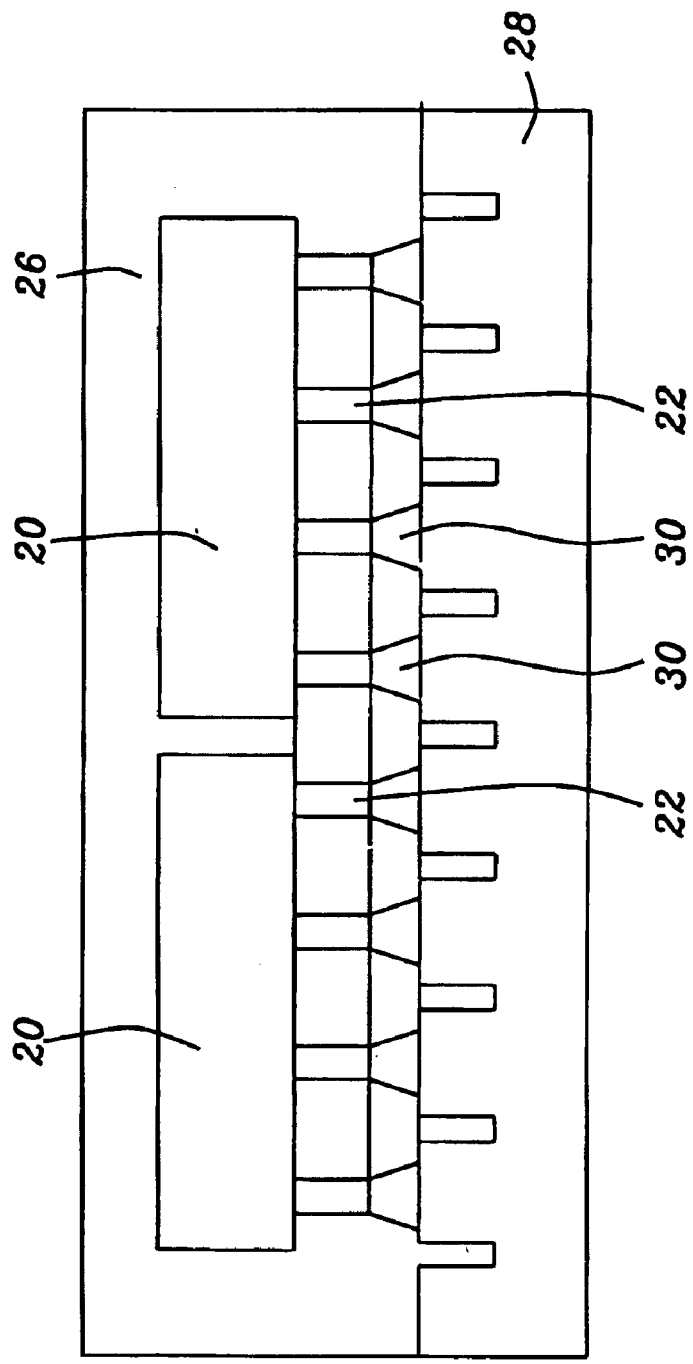
FIG. 7 is a cross-sectional view of the molded panel on the lead frame of the invention.

The lead frame tape 32 with a multiplicity of semiconductor chips 20 is molded in an encapsulant 26, shown in FIG. 7.

Figure 8:
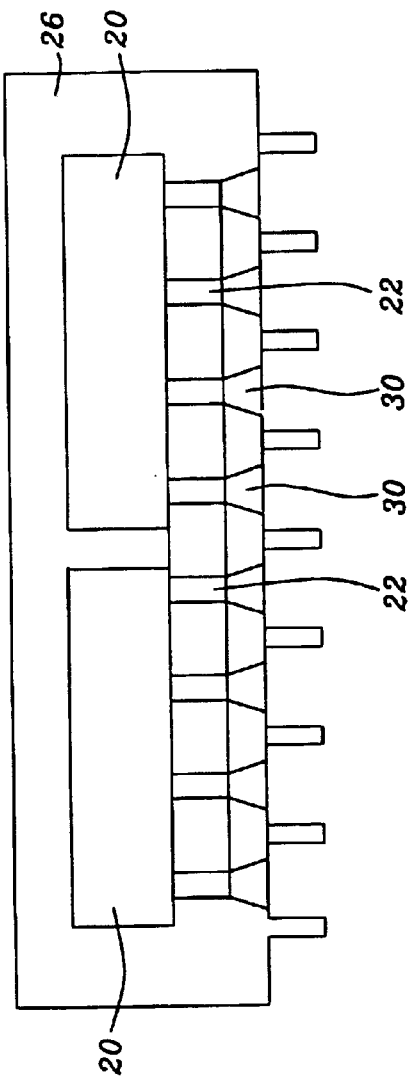
FIG. 8 is a cross-sectional view of the molded panel of the invention after the lead frame has been removed.

Heat is applied to the lead frame tape in order to melt the solder connecting the chips to the lead frame tape. The lead frame tape is then removed as shown in FIG. 8.

Figure 9:
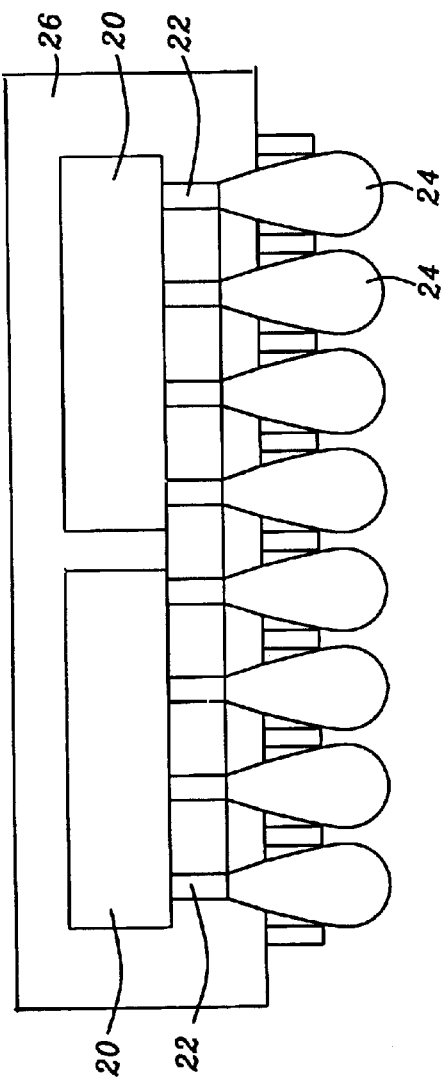
FIG. 9 is a cross-sectional view of the molded panel of the invention with the solder balls attached.

Solder is then introduced to the assembly and solder balls 24 are formed and connected to the semiconductor chip pillars 22, FIG. 9.

A dicing process is used to produce the individual modules containing one semiconductor chip and its CGA interconnects.

In the second embodiment of the invention, the same method of manufacture is used except that the lead frame tape 32 is not etched, with the resultant structure being shown in FIGS. 3A and 3B.

In the third embodiment of the invention, the same method of manufacture is used with the exception that the lead frame tape 32 is etched and serrated in such a manner as to delineate each individual semiconductor chip as shown in FIGS. 4A and 4B.

The present invention, the design and method of manufacture of a CGA semiconductor chip package has been shown to satisfy the demands placed on a semiconductor chip first level package. It protects the semiconductor and interconnects from environmental exposure and allows for use of a BGA interconnect to the next level of package.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip grid array (CGA) semiconductor chip package comprising:
   a molded encapsulant surrounding a semiconductor chip that utilizes interconnection pillars, wherein the encapsulant surrounds the said semiconductor chip and interconnection pillars and allows contact to the pillar edge;
   an array of solder balls or bumps attached to the interconnection pillars that provide electrical connections to each pillar.

2. The structure of claim 1 wherein the encapsulant is molded to have castellations surrounding each solder ball.

3. The structure of claim 1 wherein the encapsulant is molded on a non serrated lead frame tape.

4. The structure of claim 1 wherein the encapsulant is molded to have castellations surrounding each semiconductor chip package.

5. The structure of claim 1 wherein the chip is a silicon semiconductor.

6. The structure in claim 1 wherein the solder balls or bumps of the CGA are Pb—Sn solder.

7. The structure in claim 1 wherein solder paste is used for the CGA.

8. The structure of claim 1 wherein the chip is a semiconductor material.

9. The structure of claim 1 wherein the chip is a silicon semiconductor.

10. The structure of claim 1 wherein the chip is a Ga As semiconductor.

11. The structure of claim 1 wherein the encapsulant is an opaque material.

12. The structure of claim 1 wherein the encapsulant is a transparent material.

13. A method of creating a CGA semiconductor chip package comprising the steps of:
    providing a lead frame tape;
    assembling one or more semiconductor chips to said lead frame tape;
    injecting an encapsulant into said mold;
    removing the lead frame tape from said one or more semiconductor chips;
    adding solder balls to the interconnect pillars connected to each said semiconductor chip; and
    dicing said one or more semiconductor chips into individual packages.

14. The method of claim 13 wherein the lead frame tape is serrated.

15. The method of claim 13 further comprising attaching said one or more semiconductor chips to the lead frame tape by solder.

16. The method in claim 13 further comprising forming castellations from said encapsulant.

17. The method in claim 13 wherein the solder balls are integrally connected to the chip pillars.

18. The method of claim 13 wherein solder paste is integrally connected to the chip pillars.

19. The method in claim 13 wherein solder paste is used to form solder balls or bumps.

* * * * *